United States Patent [19]
Sebesta

[11] Patent Number: 6,014,809
[45] Date of Patent: Jan. 18, 2000

[54] METHOD FOR CIRCUITIZING OVER AN EDGE OF A CIRCUIT CARD

[75] Inventor: Robert D. Sebesta, Endicott, N.Y.

[73] Assignee: International Business Machines Corporation, Armonk, N.Y.

[21] Appl. No.: 09/033,618

[22] Filed: Mar. 3, 1998

[51] Int. Cl.[7] ...................................................... H05K 3/02
[52] U.S. Cl. .................................. 29/896; 29/830; 29/840
[58] Field of Search .............................. 29/832, 835, 828, 29/840, 830

[56] References Cited

U.S. PATENT DOCUMENTS

| | | |
|---|---|---|
| 3,370,203 | 2/1968 | Kravitz et al. . |
| 5,107,586 | 4/1992 | Eichelberger et al. . |
| 5,276,963 | 1/1994 | Flanders . |
| 5,388,024 | 2/1995 | Galvagni . |
| 5,459,500 | 10/1995 | Morris et al. . |
| 5,562,461 | 10/1996 | Obara et al. . |

OTHER PUBLICATIONS

IBM Technical Disclosure Bulletin vol. 23, No. 12, May, 1981, Edge–Mounted MLC Packaging Scheme, by Gegenwarth et al.

Primary Examiner—Carl J. Arbes
Attorney, Agent, or Firm—Schmeiser, Olsen & Watts; Lawrence R. Fraley

[57] ABSTRACT

The present invention provides a method of performing high density over the edge circuitization on circuit cards. In particular, the invention allows for circuits having width and spacing requirements of one millimeter or less to be placed over the edge of a substrate. The method includes the steps of: (1) angling the substrate such that the first surface, second surface and edge separating the two surfaces form an exposed region; (2) metallically sputter seeding the exposed region from a seeding source such that a metallic sputter seed layer is formed; (3) covering the exposed region with a dielectric material; (4) ablating portions of the dielectric material; (5) applying a conductive layer, for example, with copper plating, on the circuit path to form a circuit; (6) removing the remaining unablated dielectric material, thereby exposing portions of the metallic sputter seed layer that are adjacent to the circuit; and (7) removing the exposed portions of the metallic sputter seed layer that are not part of the circuit.

21 Claims, 3 Drawing Sheets

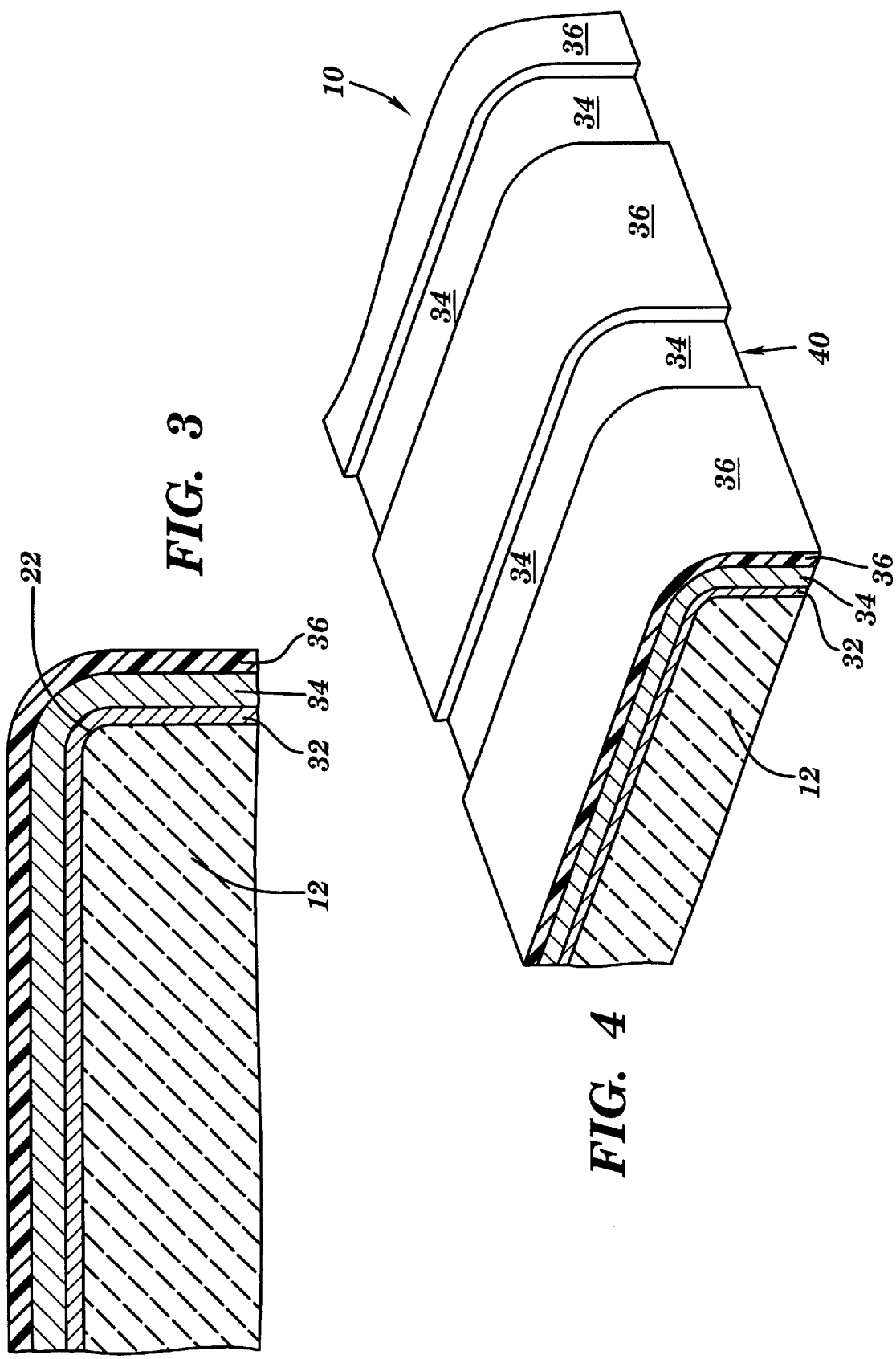

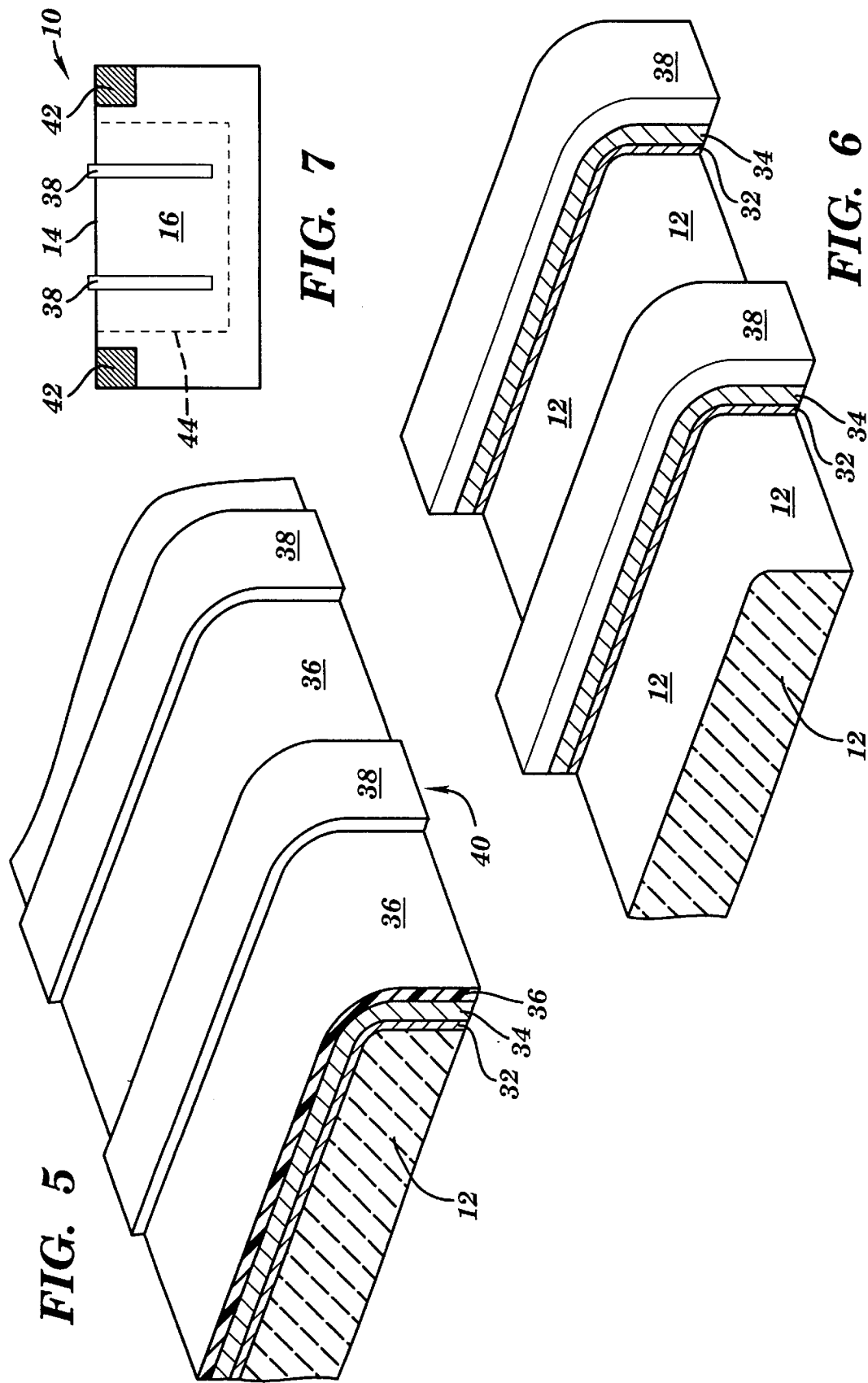

METHOD FOR CIRCUITIZING OVER AN EDGE OF A CIRCUIT CARD

BACKGROUND OF THE INVENTION

1. Technical Field

The present invention relates to providing circuits on a substrate, and more specifically relates to a method for circuitizing over an edge of a circuit card.

2. Background Art

As the electronics industry seeks to provide faster and more powerful electronic systems, there is a constant need to improve the techniques for manufacturing and packaging the devices that reside within such systems. Once such area involves circuit cards, which are required to provide smaller and smaller circuits of higher and higher functionality and precision. One method of providing increased capabilities is to fabricate circuit cards that include circuits that extend over an edge of the card. Thus, where limitations exist due to space and size requirements, circuit cards could provide a solution by having circuits that extend from a top surface of the card, over an edge, and along a side surface of the card. By providing such functionality, the circuit card can be adapted to hold more devices, more easily interface with adjacent components, save on space requirements, or simply give the system designer more flexibility in laying out circuits on the card.

However, because of the precision required in fabricating such circuit cards, manufacturers have been unable to develop a process for manufacturing cards that meet the necessary performance requirements. In particular, the prior art fails to teach any means for providing high density over the edge circuitization. Accordingly, in cases where circuit width and spacing is on the order of one mil (0.001 inch) or less, over the edge circuitization has not been feasible. Thus, without some precise and efficient means for circuitizing over an edge of a circuit card or other substrate, the ability to implement systems with such cards is limited.

SUMMARY OF THE INVENTION

The present invention provides a method for circuitizing over an edge of a substrate or circuit card such that circuits can extend between a first and second surface of the substrate with a high degree of precision and density. The method includes the steps of: (1) angling the substrate such that the first surface, second surface and edge separating the two surfaces form an exposed region; (2) metallically sputter seeding the exposed region from a seeding source such that a metallic sputter seed layer is formed; (3) covering the exposed region with a dielectric material, such as polyimide, in order to provide a protective layer; (4) ablating portions of the dielectric material, preferably with a laser, in order to define a circuit path; (5) applying a conductive layer, for example, with copper plating, on the circuit path to form a circuit; (6) removing the remaining unablated dielectric material, for example with a dry etch process, thereby exposing portions of the metallic sputter seed layer that are adjacent to the circuit; and (7) removing the exposed portions of the metallic sputter seed layer that are not part of the circuit, with a flash etch process or the like.

In order to facilitate this process, the substrate or circuit card may include registration notches cut into non-critical regions of the circuit card in order to provide reference points during the processing of the card. The non-critical areas of the circuit card can later be removed after all of the circuitizing has been accomplished.

It is therefore an advantage of the present invention to provide a method for forming precise circuits over an edge of a substrate.

It is therefore an advantage of the present invention to provide a method for forming high density circuits over an edge of a circuit card, wherein the circuits may have a width and spacing that is less than one mil (0.001 inch).

It is therefore a further advantage of the present invention to provide a less costly method of circuitizing over an edge of a circuit card.

BRIEF DESCRIPTION OF THE DRAWINGS

These and other features and advantages of the present invention will become more apparent from the following detailed description of an exemplary embodiment therefore, as illustrated in the accompanying drawings, in which:

FIG. 3 depicts a cross-sectional side view of a portion of a circuit card after a dielectric material has been added onto the seed layers in accordance with a preferred embodiment of the present invention;

FIG. 4 depicts an isometric view of a circuit card after a circuit path has been defined in accordance with a preferred embodiment of the present invention;

FIG. 5 depicts an isometric view of a circuit card after a conductive layer has been applied to the circuit path in accordance with a preferred embodiment of the present invention;

FIG. 6 depicts an isometric view of the circuit card after the unablated dielectric material has been removed in accordance with a preferred embodiment of the present invention; and FIG. 7 depicts a side view of a circuit card depicting registration notches in accordance with a preferred embodiment of the present invention.

DETAILED DESCRIPTION OF THE PREFERRED EMBODIMENT

Figure 1:
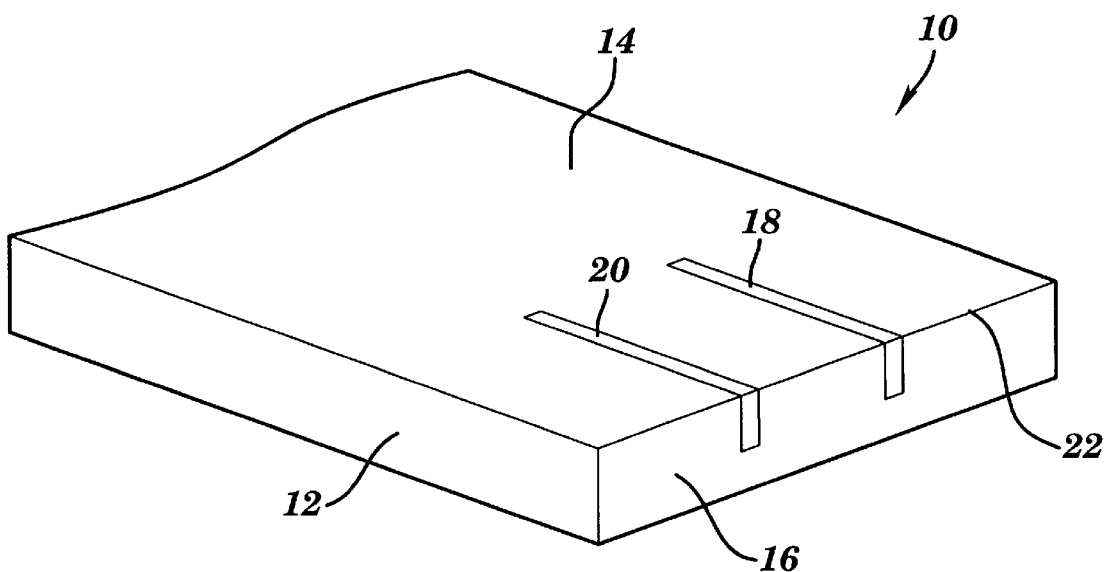
FIG. 1 depicts a circuit card with circuits extending over an edge of the circuit card in accordance with a preferred embodiment of the present invention.

FIG. 1 depicts a circuit card 10 having circuits 18 and 20 extending over edge 22. The circuit card includes a substrate 12, a top surface 14, and a side surface 16. It is recognized that substrate 12 can be comprised of any suitable material, including ceramic, plastic, etc. It is also recognized that the shape and configuration of the circuit card 10 is not limited to the view shown in FIG. 1. Moreover, it should be recognized that this invention allows for the circuitizing over any type of edge on a bulk material, and is not just limited to circuits that extend from a top surface to a side surface of a circuit card. Finally, it should be recognized that while this preferred embodiment describes a method of creating high density circuits, i.e., circuits having a width and spacing of one mil (0.001 inch) or less, the process could be utilized in any related fabrication system.

Figure 2:
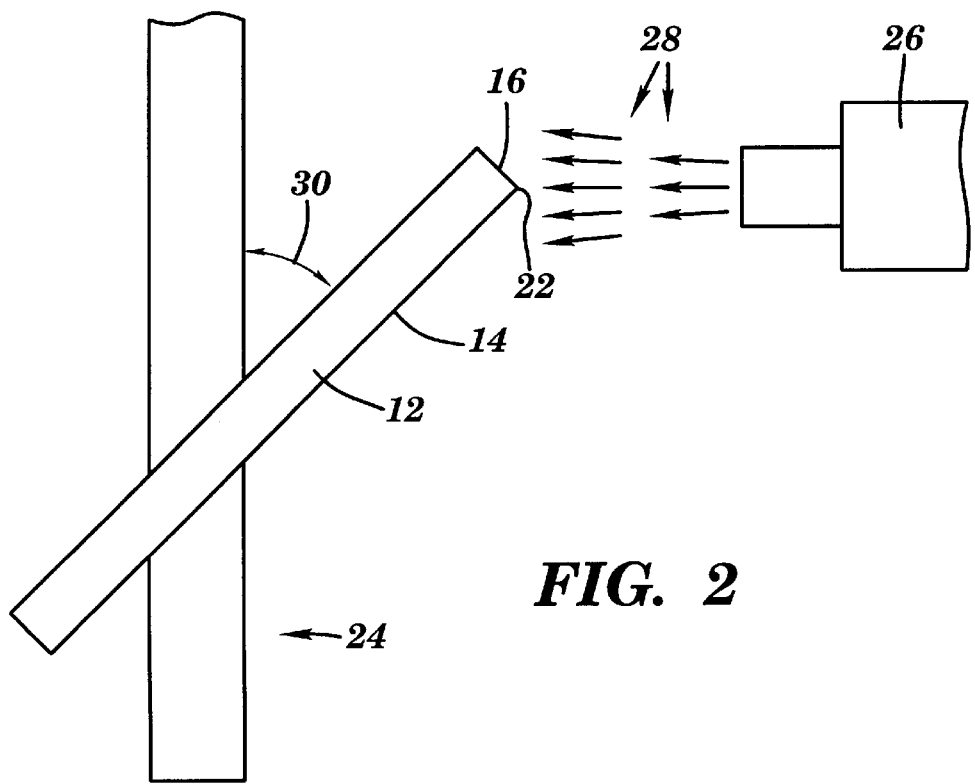
FIG. 2 depicts the step of metallically sputter seeding an angled circuit card in accordance with a preferred embodiment of the present invention.

FIGS. 2–6 depict the various steps used in the method of circuitizing a card as depicted in FIG. 1. The first step in the process is depicted in FIG. 2, where substrate 12 is shown receiving a seed layer. In particular, substrate 12 is held at an angle 30 by holder 24 such that top surface 14, side surface 16, and edge 22 form a region that is exposed to seeding device 26. With the seeding device 26 directed at the exposed region, a metallic sputter seed 28 is layered over the two surfaces 14 and 16, and along the card edge 22 in a relatively uniform manner. The seeding may be comprised of one or more thin layers of conductive material, such as a flash layer of chromium 32 and a thin layer (approximately 5000 Å) of copper 34 (see FIG. 3). Any known sputtering technique may be utilized for this process.

Substrate 12 will generally consist of any non-conductive substrate, or substrate with a non-conductive surface, suitable for receiving the conductive layering provided during the sputter seeding step. Holder 24 can be any type of mechanism capable of holding of substrate 12 at a predetermined angle 30. While in the preferred embodiment, angle 30 is shown as an acute angle (e.g., 15°), it is recognized that any angle that allows for uniform seeding could be used.

Referring now to FIG. 3, a cross-sectional side view of the substrate 12 is shown. The substrate 12 includes the two conductive layers 32 and 34 applied as described above, along with a subsequently applied dielectric material 36. The dielectric material may be comprised of any suitable substance that is generally non-conductive, yet easy to apply, such as polyimide. In a preferred embodiment, the polyimide is sprayed onto the surface and allowed to naturally flow over and around the edge 22 in order to provide a layer of about 6 microns in depth. Once applied, the polyimide layer 36 may be allowed to be cured to improve performance of the dielectric.

Referring now to FIG. 4, an isometric view of the substrate 12 is depicted with portions of the dielectric material 36 removed to create a plating mask. The plating mask defines the circuit path 40 as those areas where the dielectric has be removed. The step of creating the plating mask is accomplished by forming trenches in the dielectric material 36. Trenches are formed with a laser ablating process which removes the dielectric material 36, but leaves the underlying metal surface 34 intact. A subsequent step of removing debris may also be required at this point. Registration notches (not shown) as described with respect to FIG. 7 may be utilized to maintain registration between plane and edge during the ablating step. At this point in the fabrication process, the location of the circuit path 40 is essentially defined as the ablated regions residing between any remaining unablated dielectric material 36. Accordingly, a circuit path has been formed that extends over the edge of the substrate 12. The step of forming trenches during this ablating process can be performed in any known manner.

Referring now to FIG. 5, an isometric view of the circuit card of FIG. 4 is depicted with a conductive plating 38 applied into the ablated areas described above. Application of the conductive plating 38 forms a circuitized pattern that comprises the circuits that will reside on the circuit card 10. Conductive layer 38 may be comprised of any suitable conductive material, such as copper. This plating may be applied in any known manner, such as with electrolytic or electroless plating. (Electrolytic plating may require that electrical contact points be ablated in the polyimide film in those areas of oversize along the non-wired edges.)

FIG. 6 depicts an isometric view of the final circuit card after the circuitization process is complete. To complete the process, the unablated dielectric material 36, along with the conductive layers 32 and 34 residing beneath the unablated dielectric material 36, must be removed. Plasma etching may be utilized to remove the remaining unablated dielectric material 36. In particular, the unablated material 36 can be removed with known dry etch procedures, which essentially evaporate polyimide. It should be noted that non-uniformities of polymide removal encountered during large batch processing should not be a problem since sufficient over-ashing could be done because all of the other materials on the card 10 are relatively inert to plasm process. Next, a flash etch process may be used to remove the thin copper 34 that resided beneath the unablated polyimide. This process is carefully implemented such that the thicker copper plated regions 38 will remain in tact. Finally, a second flash etch step may be utilized to remove the remaining chromium layer 32 that was residing on the substrate 12 beneath the unablated polyimide. A nickel/gold plating or procoat, if required, could be inserted at this point if desired.

Referring finally to FIG. 7, a frontal view of the circuit card is shown with registration notches 42. As noted previously, registration notches 42 provide reference points that can be utilized during the above-described processes. The registration notches reside on the oversize regions of the substrate 12 outside of a critical region defined by dotted line 44. Once all of the processing has been accomplished, the card can be cut to a final size with grinders, or the like, removing the oversize region outside of dotted line 44.

While certain exemplary embodiments have been described and shown in the accompanying drawings, it is to be understood that such embodiments are merely illustrative of and not restricted on the broad invention, and that this invention should not be limited to the specific instructions and arrangements shown and described, since various other modifications may occur to those ordinarily skilled in the art.

We claim:

1. A method of circuitizing over an edge of a substrate such that both a first and a second surface of said substrate are uniformly circuitized, said method comprising the steps of:

angling said substrate such that said first surface, said second surface, and said edge form an exposed region;

metallically sputter seeding said exposed region from a source to form a metallic sputter seed layer;

covering said exposed region with a dielectric material to provide a protective layer;

creating a plating mask on said exposed region by ablating said dielectric in a predetermined pattern;

applying a conductive layer to said predetermined pattern to form a circuitized pattern;

removing any unablated dielectric material thereby exposing portions of said metallic sputter seed layer; and removing and said exposed metallic sputter seed layer to form a circuitized member.

2. The method of claim 1 wherein said circuitized pattern includes circuits having a width of less than one mil (0.001 inch).

3. The method of claim 1 wherein said substrate is angled between 10 and 90 degrees with respect to said source.

4. The method of claim 1 wherein said metallic sputter seed layer comprises chromium and copper.

5. The method of claim 1 wherein said step of covering said exposed region with a dielectric material includes the steps of:

spraying said first surface with polyimide and allowing said polyimide to flow over said edge and said second surface; and curing said polyimide.

6. The method of claim 1 wherein said step of ablating said dielectric includes the step of laser ablating the dielectric.

7. The method of claim 1 wherein said step of applying a conductive layer comprises the step of applying a copper plating.

8. The method of claim 1 wherein said unablating step comprises the steps of:

dry etching to remove said dielectric; and flash etching to remove exposed portions of said metallic sputter seed layer.

9. The method of claim 1 further comprising the step of applying a metallic layer.

10. The method of claim 1 comprising an initial step of grinding said edge to a predetermined profile and cutting a plurality of registration notches into the substrate.

11. The method of claim 1 comprising the further step of cutting said substrate to a final size.

12. A method of providing a circuit over an edge of a circuit card such that said circuit extends between a first and a second surface, said method comprising the steps of:

angling said circuit card such that said first surface, said second surface, and said edge form an exposed region;

metallically sputter seeding said exposed region from a source to form a metallic sputter seed layer;

covering said exposed region with a dielectric material to provide a protective layer;

ablating portions of said dielectric material to define a circuit path;

applying a conductive layer to said circuit path;

removing any remaining ablating dielectric material, thereby exposing portions of said metallic sputter seed layer that are not part of the circuit path; and removing said portions of said exposed metallic sputter seed layer that are not part of the circuit path.

13. The method of claim 12 wherein said circuit has a width of less than one mil (0.001 inch).

14. The method of claim 12 wherein said metallic sputter seed layer comprises chromium and copper.

15. The method of claim 12 wherein said dielectric material is polyimide.

16. The method of claim 12 wherein said ablating step is done with a laser in order to expose a portion of said metallic sputter seed layer that defines said circuit path.

17. The method of claim 12 wherein said conductive layer comprises copper plating.

18. The method of claim 12 wherein said step of removing said remaining dielectric material utilizes a dry etch process.

19. The method of claim 12 wherein said step of removing said portions of said exposed metallic sputter seed layer that are not part of the circuit path utilizes a flash etch process.

20. The method of claim 12 comprising an initial step of processing the edge of the circuit card to a predetermined profile and cutting registration notches into an oversized portion on the edge of the circuit card.

21. The method of claim 20 comprising the further step of removing said oversized portion on the edge of the circuit card.

* * * * *